(12) United States Patent
Matsuka et al.

(10) Patent No.: US 12,382,758 B2
(45) Date of Patent: Aug. 5, 2025

(54) WAVELENGTH CONVERSION MEMBER AND METHOD OF MANUFACTURING THE SAME

(71) Applicant: NICHIA CORPORATION, Anan (JP)

(72) Inventors: Eri Matsuka, Anan (JP); Makiko Iwasa, Anan (JP)

(73) Assignee: NICHIA CORPORATION, Anan (JP)

( * ) Notice: Subject to any disclaimer, the term of this patent is extended or adjusted under 35 U.S.C. 154(b) by 476 days.

(21) Appl. No.: 17/217,715

(22) Filed: Mar. 30, 2021

(65) Prior Publication Data
US 2021/0305469 A1    Sep. 30, 2021

(30) Foreign Application Priority Data

Mar. 31, 2020   (JP) .................................. 2020-062000
Apr. 20, 2020   (JP) .................................. 2020-074947
Jan. 26, 2021   (JP) .................................. 2021-010274

(51) Int. Cl.
*H10H 20/851*    (2025.01)
*H10H 20/01*     (2025.01)
*H10H 20/814*    (2025.01)

(52) U.S. Cl.
CPC ........ *H10H 20/8513* (2025.01); *H10H 20/01* (2025.01); *H10H 20/814* (2025.01)

(58) Field of Classification Search
CPC .......................... H10H 20/8513; H01L 33/504
USPC .......................................................... 257/98
See application file for complete search history.

(56) References Cited

U.S. PATENT DOCUMENTS

| 2003/0080341 | A1 | 5/2003 | Sakano et al. |
| 2012/0051075 | A1* | 3/2012 | Harada ................ H01L 33/508 362/510 |
| 2012/0112623 | A1 | 5/2012 | Kobashi |
| 2015/0333233 | A1 | 11/2015 | Washizu |

(Continued)

FOREIGN PATENT DOCUMENTS

| EP | 3 680 944 A1 | 7/2020 |
| JP | 2006-210490 A | 8/2006 |

(Continued)

OTHER PUBLICATIONS

Nguyen Doan Quoc Anh et al., "Color uniformity enhancement for white light LED lamps by quartz particles," 2016 5th International Symposium on Next-Generation Electronics (ISNE), IEEE, Aug. 15, 2016; Electronic ISBN:978-1-5090-2439-1; Electronic ISSN: 2378-8607 (2008).

*Primary Examiner* — Hsin Yi Hsieh
(74) *Attorney, Agent, or Firm* — Foley & Lardner LLP

(57) ABSTRACT

A wavelength conversion member includes: a light-transmissive member; and a wavelength conversion material located on a surface of the light-transmissive member and including: a resin, a phosphor with a median particle diameter of 10 μm or more and 30 μm or less, wherein an amount of the phosphor in the wavelength conversion material is 165 parts by mass or more and 400 parts by mass or less relative to 100 parts by mass of the resin, and a filler with a median particle diameter of 5 μm or more and 40 μm or less, wherein an amount of the filler in the wavelength conversion material is 5 parts by mass or more and 90 parts by mass or less relative to 100 parts by mass of the resin. A mixture volume ratio of the phosphor and the filler to the resin is 0.5 or more and 1.0 or less.

11 Claims, 6 Drawing Sheets

(56) References Cited

U.S. PATENT DOCUMENTS

| | | | |
|---|---|---|---|
| 2017/0131806 A1* | 5/2017 | Ando | G06F 3/0414 |
| 2017/0186920 A1 | 6/2017 | Kumano et al. | |
| 2018/0040775 A1 | 2/2018 | Wakamatsu et al. | |
| 2018/0233637 A1* | 8/2018 | Taruki | H01L 33/36 |
| 2019/0305193 A1* | 10/2019 | Aoyagi | H01L 33/504 |

FOREIGN PATENT DOCUMENTS

| | | |
|---|---|---|
| JP | 2009-260194 A | 11/2009 |
| JP | 2011-222852 A | 11/2011 |
| JP | 2012-049022 A | 3/2012 |
| JP | 2012-114416 A | 6/2012 |
| JP | 2015-038960 A | 2/2015 |
| JP | 2015-073084 A | 4/2015 |
| JP | 2016-048764 A | 4/2016 |
| JP | 2017-117912 A | 6/2017 |
| JP | 2018-022844 A | 2/2018 |
| JP | 2018-041858 A | 3/2018 |
| JP | 2018-133555 A | 8/2018 |
| WO | WO-2014/104295 A1 | 7/2014 |
| WO | WO-2015/033824 A1 | 3/2015 |
| WO | WO-2017/094832 A1 | 6/2017 |
| WO | WO-2019/049794 A1 | 3/2019 |

\* cited by examiner

WAVELENGTH CONVERSION MEMBER AND METHOD OF MANUFACTURING THE SAME

CROSS-REFERENCE TO RELATED APPLICATIONS

This application is based upon and claims priority to Japanese Patent Application No. 2020-062000, filed on Mar. 31, 2020, Japanese Patent Application No. 2020-074947, filed on Apr. 20, 2020, and Japanese Patent Application No. 2021-010274, filed on Jan. 26, 2021, the entire contents of each of which are incorporated herein by reference.

BACKGROUND

1. Field of the Invention

The present disclosure relates to a wavelength conversion member and a method of manufacturing the wavelength conversion member.

2. Description of Related Art

Light-emitting devices that emit light having mixed colors by combinations of light-emitting elements and phosphors are used for, for example, in illumination devices and backlights for liquid-crystal displays.

For example, as disclosed in Japanese Patent Publication No. 2015-38960, such a light-emitting device employs a structure in which a wavelength conversion member is disposed on the light extracting surface of a light-emitting element. Light emitted from the light-emitting element passes through the wavelength conversion member, and a portion of the light is subjected to wavelength conversion and then is emitted as light with different wavelengths. The wavelength conversion member is constituted of, for example, a phosphor and a resin serving as a binder.

There have been cases in which chromaticity variation in the emission surface of the wavelength conversion member becomes worse.

An object of certain embodiments of the present invention is to provide a wavelength conversion member showing reduced chromaticity variation in the emission surface of the wavelength conversion member, and a method of manufacturing the wavelength conversion member.

SUMMARY

According to one embodiment of the present invention, a wavelength conversion member includes a wavelength conversion material containing a resin, 165 parts by mass or more and 400 parts by mass or less of a phosphor with a median particle diameter of 10 µm or more and 30 µm or less relative to 100 parts by mass of the resin, and 5 parts by mass or more and 90 parts by mass or less of a filler with a median particle diameter of 5 µm or more and 40 µm or less relative to 100 parts by mass of the resin, and a light-transmissive member provided with the wavelength conversion material on one surface of the light-transmissive member. A mixture volume ratio of the phosphor and the filler to the resin is 0.5 or more and 1.0 or less.

According to another embodiment of the present invention, a light-emitting device includes a support member, a light-emitting element on or above the support member, the wavelength conversion member on or above the light-emitting element, and a light-reflective member on a lateral side of the light-emitting element and the wavelength conversion member. The light-emitting element is located on or above a surface of the light-transmissive member, the surface being provided with the wavelength conversion material.

According to another embodiment of the present invention, a method of manufacturing a wavelength conversion member includes providing a mixture of a resin, 165 parts by mass or more and 400 parts by mass or less of a phosphor with a median particle diameter of 10 µm or more and 30 µm or less relative to 100 parts by mass of the resin, and 5 parts by mass or more and 90 parts by mass or less of a filler with a median particle diameter of 5 µm or more and 40 µm or less relative to 100 parts by mass of the resin, a mixture volume ratio of the phosphor and the filler to the resin being 0.5 or more and 1.0 or less; printing the mixture on one surface of a light-transmissive plate material; and hardening the mixture printed on the light-transmissive plate material.

According to certain aspect of the present invention, chromaticity variation in the emission surface of a wavelength conversion member can be reduced.

DETAILED DESCRIPTION OF EMBODIMENTS

Figure 1:
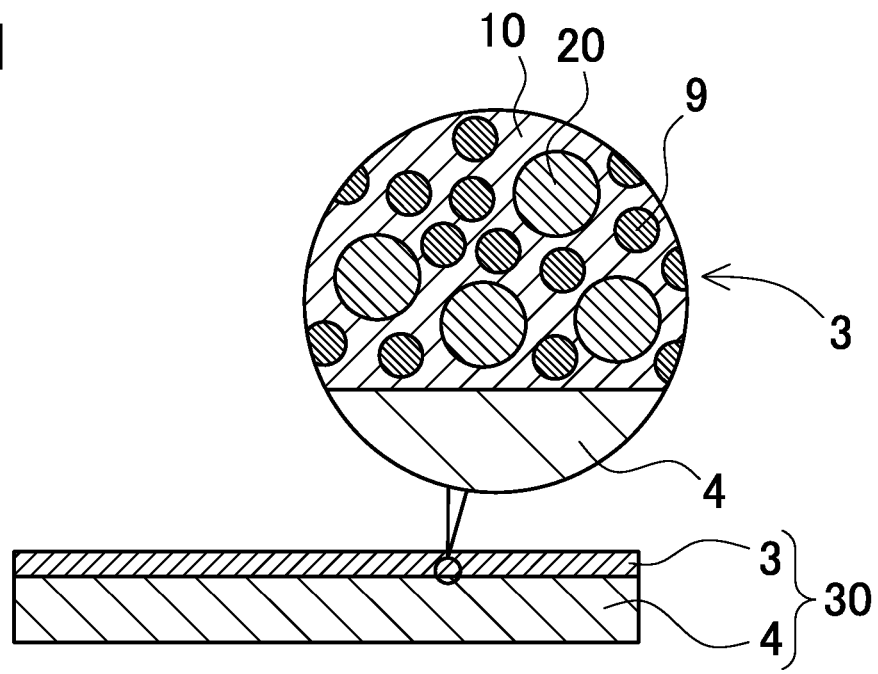
FIG. 1 is a schematic cross-sectional view of a wavelength conversion member according to a first embodiment of the present invention.

Certain embodiments of the present invention may be configured as described below.

According to one embodiment of the present invention, a wavelength conversion member includes a wavelength conversion material containing a resin, 165 parts by mass or more and 400 parts by mass or less of a phosphor with a median particle diameter of 10 µm or more and 30 µm or less relative to 100 parts by mass of the resin, and 5 parts by mass or more and 90 parts by mass or less of a filler with a median particle diameter of 5 µm or more and 40 µm or less relative to 100 parts by mass of the resin, and a light-transmissive member provided with the wavelength conversion material on one surface of the light-transmissive member. A mixture volume ratio of the phosphor and the filler to the resin is 0.5 or more and 1.0 or less.

In the wavelength conversion member, a refractive index of the resin may be 1.4 or more and 1.6 or less.

In the wavelength conversion member according to any of the any of the preceding embodiments, a refractive index of the filler may be 1.4 or more and 1.8 or less.

In the wavelength conversion member according to any of the any of the preceding embodiments, an absolute value of a difference in refractive index between the resin and the filler may be 0.35 or less.

In the wavelength conversion member according to any of the any of the preceding embodiments, the filler may include at least one selected from the group consisting of silicon oxide, aluminum oxide, and titanium oxide.

In the wavelength conversion member according to any of the any of the preceding embodiments, the resin may include at least one selected from the group consisting of a phenyl silicone resin and a dimethyl silicone resin.

In the wavelength conversion member according to any of the any of the preceding embodiments, the phosphor may include at least one phosphor selected from the group consisting of
(1) a rare-earth aluminate phosphor including Ce, Al, at least one element Ln selected from the group consisting of Y, La, Lu, Gd, and Tb, and optionally at least one element selected from Ga and Sc;
(2) a B-SiAlON phosphor having a composition including Si, Al, O, N, and Eu;
(3) a halosilicate phosphor having a composition including Ca, Eu, Mg, Si, O, and at least one halogen element selected from the group consisting of F, Cl, and Br;
(4) a nitride phosphor having a composition including Ca, Eu, Si, Al, N, and optionally Sr and
(5) a fluoride phosphor having a composition including at least one element selected from the group consisting of alkali metal and ammonium, at least one element selected from the group consisting of group 13 elements and group 14 elements, fluorine, and Mn.

In the wavelength conversion member according to any of the any of the preceding embodiments, the phosphor may include at least one phosphor selected from the group consisting of a rare-earth aluminate phosphor having a composition represented by Formula (1) below, a halosilicate phosphor having a composition represented by Formula (2) below, a B-SiAlON phosphor having a composition represented by Formula (3) below, a nitride phosphor having a composition represented by Formula (4) below, and a fluoride phosphor having a composition represented by Formula (5) below.

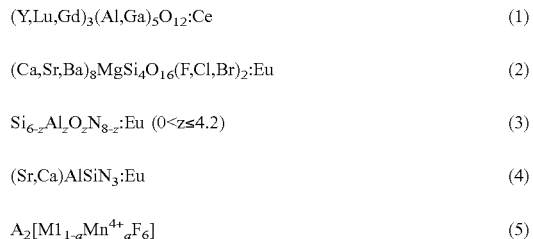

In formula (5), "A" contains at least one element selected from the group consisting of alkali metals and ammonium, and preferably contains at least potassium; "M1" contains at least one element selected from the group consisting of group 4 elements, group 13 elements, and group 14 elements; and "a" is 0.01<a<0.2.

In the wavelength conversion member according to any of the any of the preceding embodiments, a standard deviation of a chromaticity at an appropriate point on an emission surface of the wavelength conversion member excited by light with a peak emission wavelength of 443 nm may be preferably 0.0065 or less, more preferably 0.0054 or less, and an even lower standard deviation is more preferable.

In the wavelength conversion member according to any of the any of the preceding embodiments, the light-transmissive member may contain at least one selected from the group consisting of glass, a resin, and a phosphor.

In the wavelength conversion member according to any of the any of the preceding embodiments, a total thickness of the wavelength conversion material and the light-transmissive member may be 130 μm or more and 300 μm or less.

According to another embodiment of the present invention, a light-emitting device includes a support member, a light-emitting element on or above the support member, the wavelength conversion member on or above the light-emitting element, and a light-reflective member on a lateral side of the light-emitting element and the wavelength conversion member. The light-emitting element is located on or above a surface of the light-transmissive member, the surface being provided with the wavelength conversion material.

According to another embodiment of the present invention, a method of manufacturing a wavelength conversion member includes providing a mixture of a resin, 165 parts by mass or more and 400 parts by mass or less of a phosphor with a median particle diameter of 10 μm or more and 30 μm or less relative to 100 parts by mass of the resin, and 5 parts by mass or more and 90 parts by mass or less of a filler with a median particle diameter of 5 μm or more and 40 μm or less relative to 100 parts by mass of the resin, a mixture volume ratio of the phosphor and the filler to the resin being 0.5 or more and 1.0 or less; printing the mixture on one surface of a light-transmissive plate material; and hardening the mixture printed on the light-transmissive plate material.

In the method of manufacturing a wavelength conversion member, the step of hardening the mixture may include sedimenting the phosphor and the filler by turning the light-transmissive plate material provided with the printed mixture upside down and then hardening the mixture.

In the method of manufacturing a wavelength conversion member according to any of the any of the preceding embodiments, the mixture volume ratio of the phosphor and the filler to the resin may be 0.6 or more and 0.9 or less.

In the method of manufacturing the above wavelength conversion member according to any of the embodiments, a thickness of a layer of the phosphor printed on the light-transmissive plate material may be 30 μm or more and 150 μm or less.

Certain embodiments of the present invention will be described below with reference to the drawings as needed. The embodiments below are examples intended to give a concrete form to the technical concepts of the present invention. However, the present invention is not limited to the description in the embodiments below. Also, in the present specification, members disclosed in the claims are not limited to members in the described examples. In particular, unless specifically stated otherwise, the present invention is not limited to the sizes, materials, shapes, and relative positions of constituent members described in the examples. Rather, the described examples are merely for illustration. It should be noted that sizes or positional relationships of members illustrated in the drawings may be exaggerated for clarity. Furthermore, in the descriptions below, the same name or the same reference numeral represents the same member or a member made of the same material, and its duplicative description will be omitted as appropriate. As for each element of an embodiment, a plurality of elements can be formed of one member so that the member serves as the plurality of elements, or conversely, a combination of a plurality of members can fulfill the function of one member. Some configurations described in some of the examples or embodiments may be applicable to other examples or embodiments.

Wavelength Conversion Member 30

Figure 2:
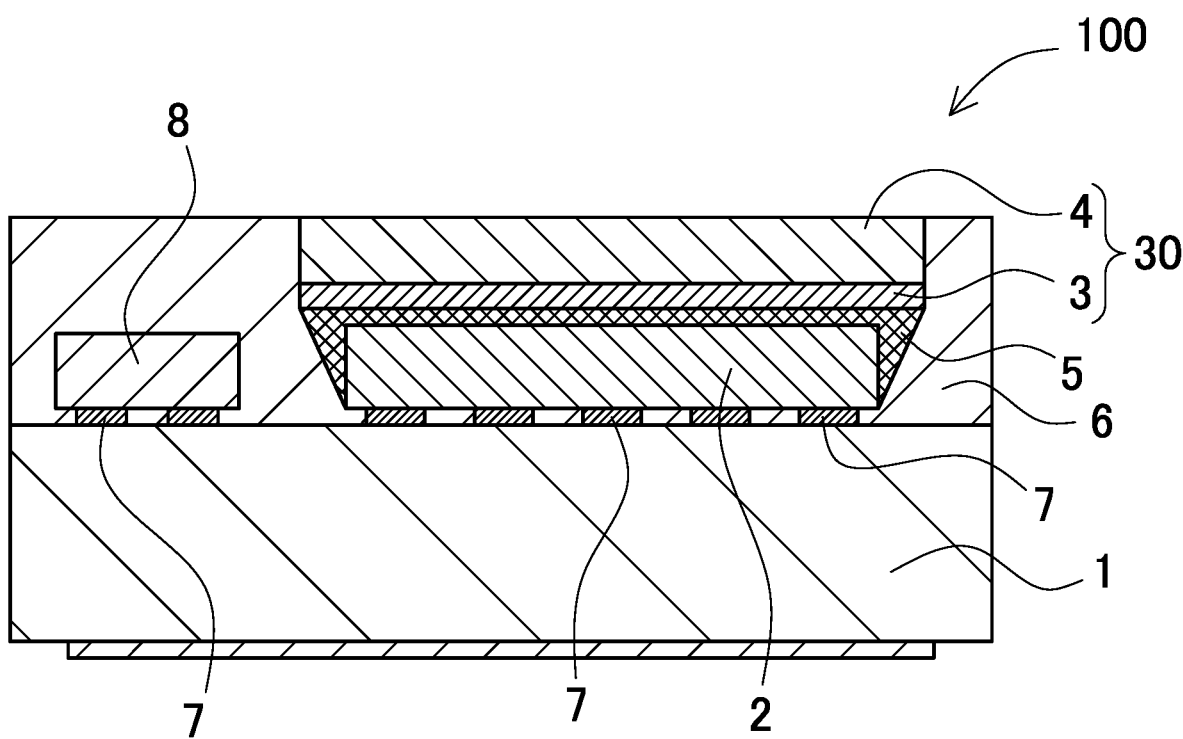
FIG. 2 is a schematic cross-sectional view of a light-emitting device including the wavelength conversion member according to the first embodiment of the present invention.

FIG. 1 is a schematic cross-sectional view of a wavelength conversion member 30, and FIG. 2 is a schematic cross-sectional view of a light-emitting device 100 including the wavelength conversion member 30. The wavelength conversion member 30 includes a light-transmissive member 4 and a phosphor layer 3 serving as a wavelength conversion material provided on one main surface of the light-transmissive member 4. The one main surface of the light-transmissive member 4 faces a light-emitting element 2 when the light-emitting device 100 is constituted using the wavelength conversion member 30. The phosphor layer 3 is a wavelength conversion material containing a resin 10, and a phosphor 9 and a filler 20 disposed in the resin 10.

The resin 10 is a binder that is hardened to retain the phosphor 9 and the filler 20 in a dispersed state. At least one selected from a phenyl silicone resin and a dimethyl silicone resin can be used for the binder.

The content of the filler 20 is preferably 5 parts by mass or more and 90 parts by mass or less relative to 100 parts by mass of the resin 10. The median particle diameter of the filler 20 is preferably 5 μm or more and 40 μm or less. At least one selected from silicon oxide, aluminum oxide, and titanium oxide can be used for the filler 20.

In addition to the filler 20, a filler with a median particle diameter of 5 μm or less can also be used. The content of such an additional filler is preferably 0 parts by mass or more and 15 parts by mass or less, more preferably 1 part by mass or more and 10 parts by mass or less, relative to 100 parts by mass of the resin 10.

The mixture volume ratio of the phosphor 9 and the filler 20 to the resin 10 is preferably 0.5 or more and 1.0 or less, more preferably 0.6 or more and 0.9 or less. Addition of the filler 20 can prevent the phosphor 9 from aggregating, so that chromaticity variation can be reduced.

Figure 3:
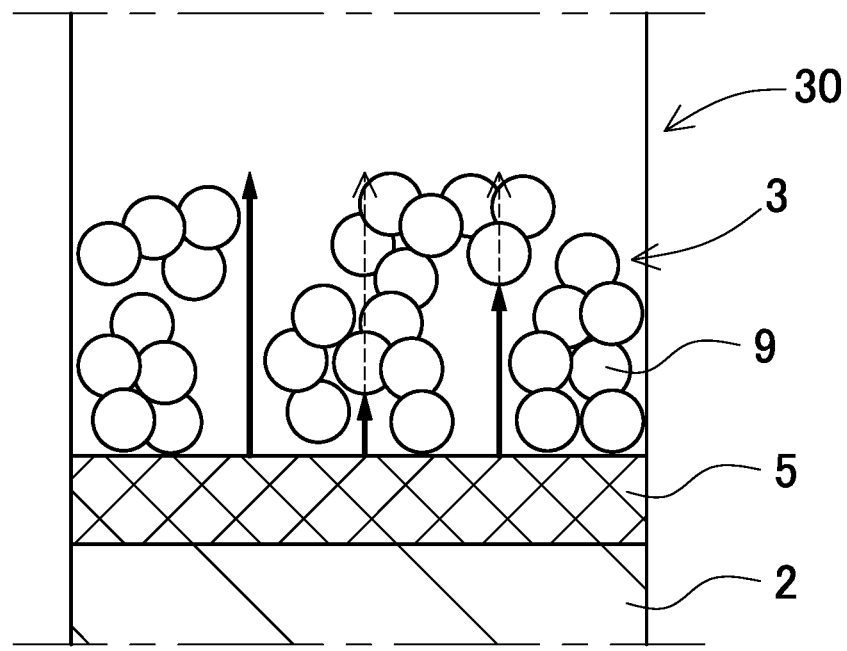
FIG. 3 is a schematic enlarged cross-sectional view of the light-emitting device illustrating worsening of chromaticity variation.
Figure 4:
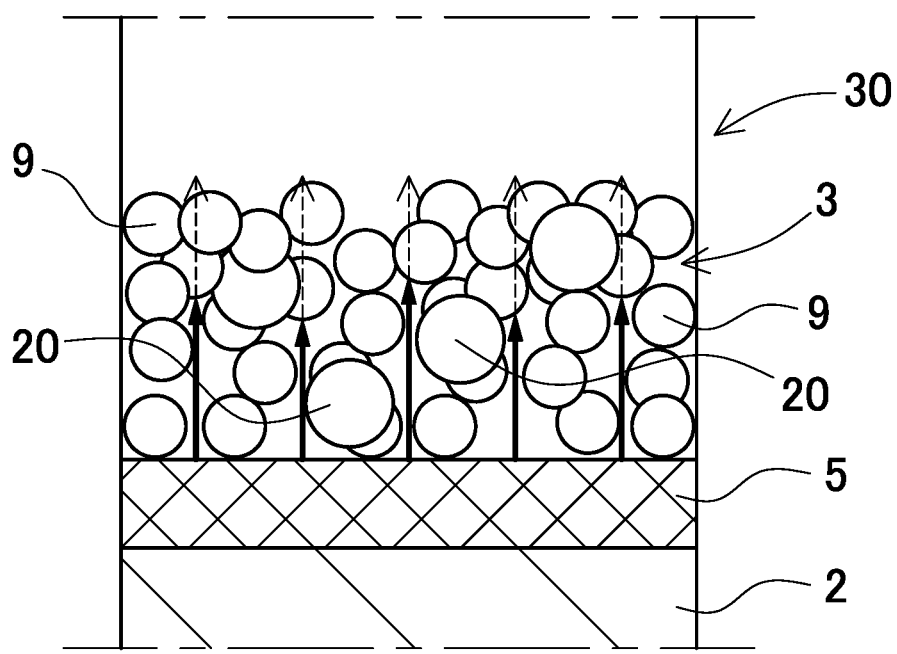
FIG. 4 is a schematic enlarged cross-sectional view of the light-emitting device illustrating reduced chromaticity variation.

When a phenyl resin is used for the resin 10, the phosphor 9 is likely to aggregate as shown in the schematic enlarged cross-sectional view of the light-emitting device 100 in FIG. 3, and chromaticity variation in a surface may become worse. In particular, when the phosphor layer 3 is formed by applying the wavelength conversion material, the phosphor 9 is unevenly disposed in the phosphor layer 3, and the difference in the degree of ease of transmission of light, such as blue light, from the light-emitting element 2 between different portions increases. In particular, a phenyl resin has a surface tension higher than the surface tension of a dimethyl resin, and the phosphor is likely to aggregate. Addition of the filler 20 into the gaps between phosphor particles allows for reducing aggregation of the phosphor 9, as shown in the schematic enlarged cross-sectional view of FIG. 4.

A filler 20 that does not largely differ in refractive index from the resin 10 is used for the filler, which reduces decrease in the luminous flux. Specifically, the refractive index of the resin 10 is preferably 1.4 or more and 1.6 or less. The refractive index of the filler 20 is preferably 1.4 or more and 1.8 or less. The absolute value of the difference in refractive index between the resin 10 and the filler 20 is preferably 0.35 or less.

The light-transmissive member 4 can be made of glass, a resin, a phosphor, or the like. The thickness of the wavelength conversion member 30 including the phosphor layer 3 and the light-transmissive member 4 is preferably 130 μm or more and 300 μm or less. With this thickness, the mechanical strength in the manufacturing process of the light-emitting device can be maintained.

The content of the phosphor 9 is preferably 165 parts by mass or more and 400 parts by mass or less relative to 100 parts by mass of the resin 10. The median particle diameter of the phosphor 9 is preferably 10 μm or more and 30 μm or less. At least one selected from a rare-earth aluminate phosphor, a β-SiAlON phosphor, a halosilicate phosphor, a nitride phosphor, and a fluoride phosphor can be used for the phosphor 9.

A rare-earth aluminate phosphor has a composition including Ce, Al, at least one element Ln selected from the group consisting of Y, La, Lu, Gd, and Tb, and optionally at least one element selected from Ga and Sc. For example, the formula may be:

$$(Y,Lu,Gd)_3(Al,Ga)_5O_{12}:Ce$$

A β-SiAlON phosphor has a composition including Si, Al, O, N, and Eu. For example, the formula may be:

$$Si_{6-z}Al_zO_zN_{8-z}:Eu\ (0<z\leq 4.2)$$

A halosilicate phosphor has a composition including Ca, Eu, Mg, Si, O, and at least one halogen element selected from the group consisting of F, Cl, and Br. For example, the composition formula may be as follows.

$$(Ca,Sr,Ba):MgSi_4O_{16}(F,Cl,Br)_2:Eu$$

A nitride phosphor has a composition including Ca, Eu, Si, Al, N, and optionally Sr. For example, the formula may be:

$$(Sr,Ca)AlSiN_3:Eu$$

a fluoride phosphor having a composition including at least one element selected from the group consisting of alkali metal and ammonium, at least one element selected from the group consisting of group 13 elements and group 14 elements, fluorine, and Mn. For example, the formula may be:

$$A_2[M1_{1-a}Mn^{4+}{}_aF_6]$$

In this formula, "A" contains at least one element selected from the group consisting of alkali metals and ammonium, and preferably contains at least potassium; "M1" contains at least one element selected from the group consisting of group 4 elements, group 13 elements, and group 14 elements, preferably contains at least one element selected from the group consisting of silicon, aluminum, germanium and titanium, and more preferably contains at least one element selected from the group consisting of silicon, aluminum; and." "a is 0.01<a<0.2.

Light-Emitting Device 100

The light-emitting device 100 includes a board 1, the light-emitting element 2 mounted on the board 1, and the wavelength conversion member 30 disposed on the light-emitting element 2 as shown in the schematic cross-sectional view of FIG. 2. As described above, the wavelength conversion member 30 includes the phosphor layer 3 as the wavelength conversion material and the light-transmissive member 4.

The light-emitting element 2 can be flip-chip mounted on the board 1 with electrically conductive members 7 therebetween. The wavelength conversion member 30 can be bonded to the light-emitting element 2 with an adhesive layer 5 therebetween. The light-emitting device 100 may further include a light-reflective member 6 lying along lateral surfaces of the light-emitting element 2, the phosphor layer 3, and the light-transmissive member 4.

The light-emitting device 100 may further include as needed a semiconductor element flip-chip mounted on the board 1 with the electrically conductive members 7 therebetween. Examples of the semiconductor element include a protective element, such as a Zener diode, and a control element, such as a transistor.

The area of the phosphor layer 3, particularly the area of the main surface facing the light-emitting element 2, can be the same as the area of the upper surface of the light-emitting element 2. Considering the accuracy in mounting in the manufacturing process, if the area of the phosphor layer 3 is the same as the area of the upper surface of the light-emitting element 2, a portion of the upper surface of the light-emitting element 2 may not be provided with the phosphor layer 3. In order to reliably dispose the phosphor layer 3 on the entire upper surface of the light-emitting element 2, in the light-emitting device 100, the area of the phosphor layer 3 is preferably larger than the area of the upper surface of the light-emitting element 2. In this case, the phosphor layer 3 can be disposed on the light-emitting element 2 such that the phosphor layer 3 includes an exposed portion not covered with the upper surface of the light-emitting element 2 as a portion on the surface bonded to the light-emitting element 2. The area of the phosphor layer 3 can be equal to the area of the main surface of the light-transmissive member 4 on which the phosphor layer 3 is formed as needed.

Method of Manufacturing Wavelength Conversion Member

Figure 5:
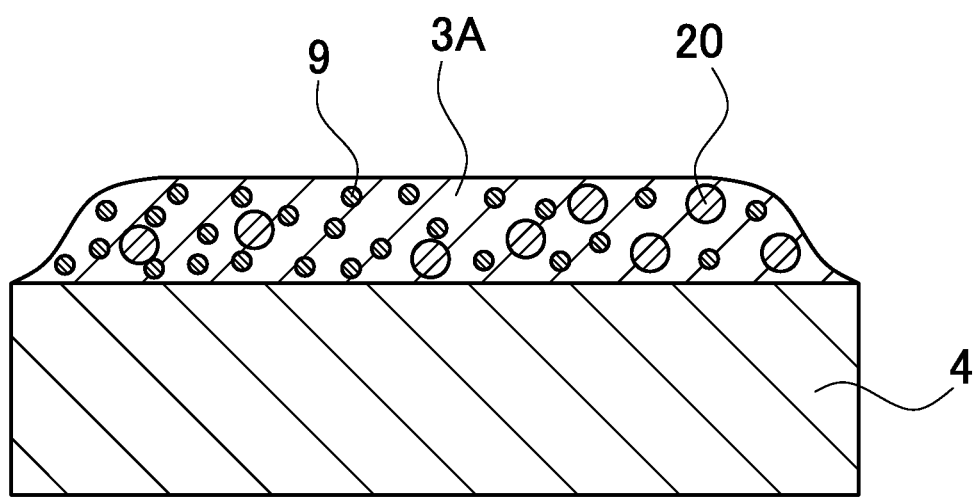
FIG. 5 is a schematic cross-sectional view illustrating a method of manufacturing a wavelength conversion member.

FIG. 5 and FIG. 6A to FIG. 6C are schematic cross-sectional views illustrating a method of manufacturing a wavelength conversion member. Phosphor paste 3A containing the phosphor 9 and a binder is disposed on one main surface of the light-transmissive member 4 as shown in FIG. 5. At least one of the main surface of the light-transmissive member 4 provided with the phosphor layer 3 and the other main surface opposite to that surface may be roughened in advance by, for example, etching or laser machining. This allows for reducing unevenness in light emitted from a light-emitting device.

The phosphor layer 3 is formed on the surface of the light-transmissive member 4 by printing. The method of forming the phosphor layer in the present invention is not limited to printing. Other methods such as known formation methods including compression molding, phosphor electrodeposition, and bonding of a phosphor sheet or combinations of printing and these formation methods may be employed as appropriate. In the case of printing, the thickness of the phosphor layer is preferably 30 µm or more and 150 µm or less, more preferably 60 µm or more and 100 µm or less, considering reduction in unevenness in light emitted from the wavelength conversion member and workability at the time of printing.

Printing

Phosphor paste containing the phosphor 9, the binder, and the filler 20 is prepared and applied to a surface (main surface) of the light-transmissive member 4. The phosphor described above can be used for the phosphor 9. A resin such as a silicone resin, an epoxy resin, a phenolic resin, and a polyimide resin or glass can be used for the binder. At least one selected from silica, titanium oxide, barium titanate, aluminum oxide, and silicon oxide can be used for the filler 20. The phosphor paste can be applied by, for example, moving a squeegee to allow the phosphor paste to penetrate a screen printing plate disposed on the light-transmissive member, so that the phosphor paste with a predetermined thickness is applied to the light-transmissive member. This allows the phosphor paste with a substantially uniform thickness to be applied.

Figure 6A:
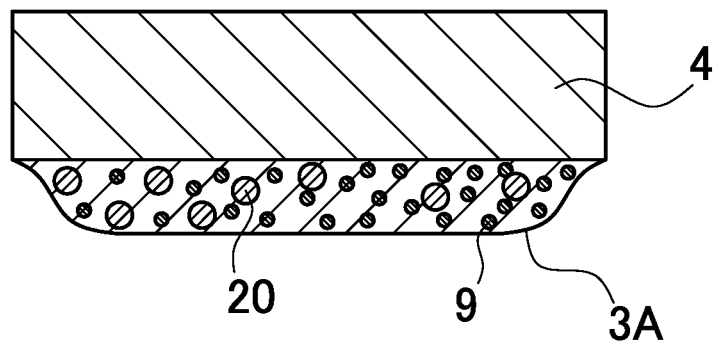
FIG. 6A to FIG. 6C are schematic cross-sectional views illustrating the method of manufacturing the wavelength conversion member.
Figure 6B:
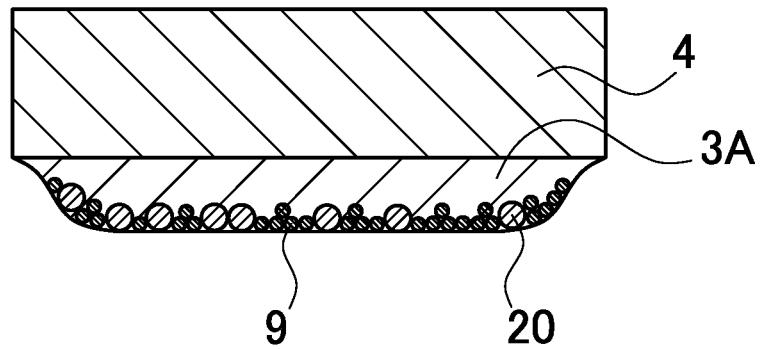
Figure 6C:
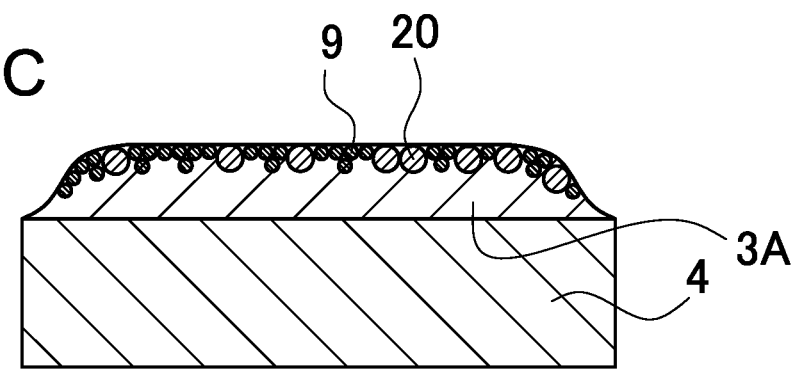

After the phosphor paste 3A is applied to the one main surface of the light-transmissive member 4 as shown in FIG. 5, the main surface of the light-transmissive member 4 to which the phosphor paste 3A has been applied is caused to face downward as shown in FIG. 6A. That is, the light-transmissive member 4 is turned upside down such that the two main surfaces, or the upper and lower main surfaces, of the light-transmissive member 4 change places. In the phosphor paste 3A, the phosphor 9 is then sedimented on the surface opposite to the surface in contact with the light-transmissive member 4 as shown in FIG. 6B. Examples of the sedimentation method include spontaneous sedimentation using the gravity applied to the phosphor 9. Such an operation can cause the concentration of the phosphor 9 in the phosphor layer 3 formed on the main surface of the light-transmissive member 4 facing the light-emitting element 2 to be higher on the surface closer to the light-emitting element 2 than on the surface closer to the light-transmissive member 4 in the direction perpendicular to the main surface. The binder of the phosphor paste 3A is then hardened in a state where a desired distribution of the phosphor 9 in the phosphor paste 3A is obtained (preferably a state where the phosphor 9 is completely sedimented) to provide the phosphor layer 3. Substantially the same (a substantially uniform) concentration of the phosphor 9 in a direction parallel to the main surface of the light-transmissive member 4 can thus be obtained. The binder is hardened by an appropriate method such as drying, heating, or ultraviolet irradiation according to the type of the binder.

The wavelength conversion member 30 of the present embodiment can be obtained by the method described above. In the phosphor layer 3 formed on the light-transmissive member 4 by such a method, the concentration distribution of the phosphor 9 may not be in a desired state in the vicinity (hereinafter referred to as a "peripheral portion") of the perimeter of the phosphor layer 3 in a plan view from the direction perpendicular to the main surface of the light-transmissive member 4 on which the phosphor layer 3 has been formed. Particularly in the case in which the phosphor layer 3 is formed by printing, the phosphor layer 3 may become thinner toward the peripheral portion as shown in FIG. 5, and the state of distribution of the phosphor may vary between a portion away from the peripheral portion and the peripheral portion, which leads to deviation of the phosphor particles from desired positions. When such a wavelength conversion member is used, chromaticity deviation may occur. In order to solve such a problem, it is preferable to add a step of selecting a region showing substantially the same distribution of the phosphor from an inner region except for the peripheral portion of the phosphor layer 3 (inner region except for the peripheral portion of the phosphor layer 3 and the peripheral portion of the light-transmissive member 4) and cutting out the phosphor layer 3 and the light-transmissive member 4 in predetermined shapes along cutting lines 11 shown in FIG. 7. The step of cutting out provides a wavelength conversion member with substantially the same distribution of the concentration of the phosphor in the phosphor layer 3 in a direction parallel to the main surface of the light-transmissive member 4. More preferably, a portion to be cut out as the wavelength conversion member is selected, in addition to adjusting the amount of the phosphor and the sedimentation time described above, so that phosphor particles can be arranged throughout the space extending from a lateral surface of the phosphor layer 3 exposed in the step of cutting out to the opposite lateral surface as shown in FIG. 1. With such an arrangement of the phosphor, chromaticity deviation can be reduced when a light-emitting device is constituted.

Modification of Method of Manufacturing Wavelength Conversion Member

Figure 7:
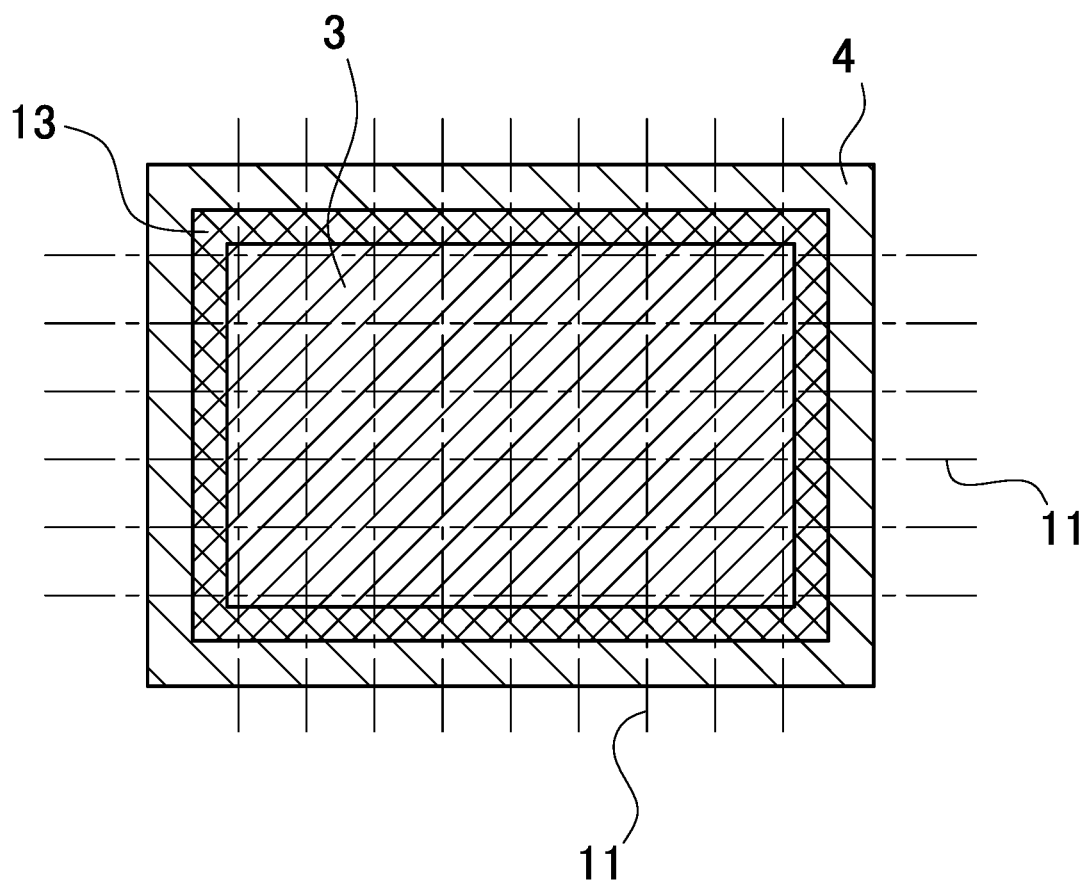
FIG. 7 is a schematic plan view illustrating a modification of the method of manufacturing a wavelength conversion member.

FIG. 7 is a schematic plan view illustrating a modification of the method of manufacturing a wavelength conversion member. By the method shown in FIG. 7, many wavelength conversion members can be more efficiently manufactured. The conditions described above can be employed as the manufacturing conditions unless otherwise described.

The phosphor paste 3A is applied to one main surface of the light-transmissive member 4. Subsequently, the main surface of the light-transmissive member 4 to which the phosphor paste 3A has been applied is caused to face downward. In the phosphor paste 3A, the phosphor 9 is then sedimented on the surface opposite to the surface in contact with the light-transmissive member 4. Such an operation can cause the concentration of the phosphor 9 in the phosphor layer 3 formed on the main surface of the light-transmissive member 4 facing the light-emitting element 2 to be higher on the surface closer to the light-emitting element 2 than on the surface closer to the light-transmissive member 4 in the direction perpendicular to the main surface and to be substantially the same (substantially uniform) in a direction parallel to the main surface. The binder of the phosphor paste 3A is then hardened in a state where a desired distribution of the phosphor 9 in the phosphor paste 3A is obtained (state where the phosphor 9 has been sedimented) to provide the phosphor layer 3.

By a singulation step which cutting is performed along the cutting lines 11 shown in FIG. 7, a plurality of wavelength conversion members 30 with a predetermined shape can be obtained.

In the singulation step, it is preferable to cut out and singulate individual wavelength conversion members 30 (the phosphor layer 3 and the light-transmissive member 4) with a predetermined shape from the inner region except for a peripheral portion 13 described above such that the singulated wavelength conversion members 30 do not include the peripheral portion 13 of the phosphor layer 3. Similarly to the case of the wavelength conversion member described above, a region showing substantially the same distribution of the phosphor 9 is selected and the phosphor layer 3 and the light-transmissive member 4 with predetermined shapes are cut out, so that chromaticity deviation can be reduced. Among the wavelength conversion members cut out, wavelength conversion members showing substantially the same distribution of the phosphor 9 in the phosphor layer can be selected and used to manufacture a plurality of light-emitting devices having uniform optical properties.

An example of a method of measuring the concentration of the phosphor 9 in a direction parallel to the main surface of the light-transmissive member 4 (main surface on which the phosphor layer 3 has been formed) is to estimate the concentration distribution of the phosphor 9 in the direction using the chromaticity of light emitted when the phosphor layer 3 is irradiated with excitation light of the phosphor 9 before the singulation step is performed.

Method of Measuring Particle Diameter of Phosphor

The median particle diameter of particles of the phosphor 9 or the filler 20 in the present specification refers to the volume average particle diameter (median diameter), or the particle diameter (D50: median diameter) at a cumulative volume frequency of 50% from the small-diameter side. The median particle diameters were measured with a laser-diffraction particle size analyzer (Mastersizer 2000 manufactured by Malvern Panalytical Ltd.).

Method of Measuring Wavelength Conversion Member

Figure 8A:
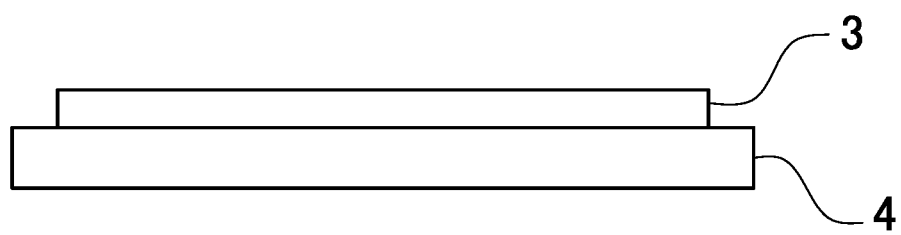
FIG. 8A is a schematic lateral view of the wavelength conversion member.
Figure 8B:
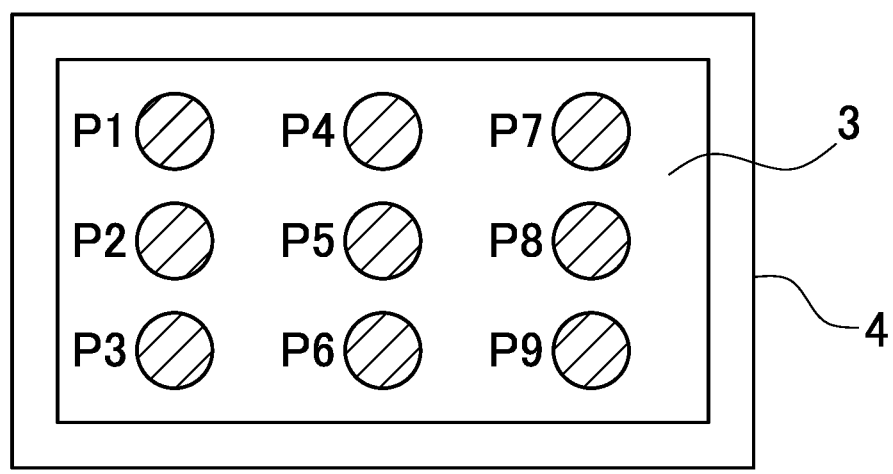
FIG. 8B is a schematic plan view illustrating positions at which color tones of the wavelength conversion member shown in FIG. 8A are measured.

Light with a peak emission wavelength of 443 nm and a half width of 17.4 nm was emitted at each of a plurality of points in the emission surface of a wavelength conversion member, and the chromaticity coordinates (x,y) of the color of the light emitted at a respective one of the emission points were measured with a spectrophotometer (product number: PMA-12, manufactured by Hamamatsu Photonics K.K.). Table 1 shows the results. Printed glass shown in FIG. 8A and FIG. 8B was used for the wavelength conversion member. A glass plate was used as the light-transmissive member 4, and a wavelength conversion material was provided on the upper surface of the glass plate as shown in FIG. 8A as described below. Color tones at nine appropriate measurement points P1 to P9 in the emission surface of the wavelength conversion material were measured as shown in the schematic plan view of FIG. 8B, and the standard deviation of a color tone x for a single wavelength conversion material was calculated by using a common standard deviation formula. The magnitude of chromaticity variation of nine appropriate points is considered to be almost the same regardless of which points are selected as the measurement points. Color tones at nine appropriate points were measured for each wavelength conversion member, and the average of standard deviations of the color tone x for each wavelength conversion member was calculated.

The surface condition and coating properties in each of examples and comparative examples were inspected. The surface of the phosphor layer 3 was observed to evaluate the surface condition. A large difference in concentration (unevenness) of the phosphor layer is indicated by "x", a little unevenness is indicated by "Δ", and almost no unevenness is indicated by "○". As for the coating properties, "○" indicates that the phosphor paste was able to be applied as the phosphor layer 3 to the entire main surface of the light-transmissive member 4 by screen printing, and "x" indicates that the phosphor paste was not able to be applied.

TABLE 1

|  | Content of phosphor relative to 100 parts by mass of resin [parts by mass] | Content of silica relative to 100 parts by mass of resin [parts by mass] | Content of alumina relative to 100 parts by mass of resin [parts by mass] | Mixture volume ratio (silica + phosphors)/ resin | Standard deviation of color tone × (average) | Surface condition | Coating properties |
|---|---|---|---|---|---|---|---|
| Comparative Example 1 | 160 | 0 | 3.3 | 0.37 | 0.0067 | x | ○ |
| Comparative Example 2 | 350 | 75 | 5.3 | 1.18 | — | — | × |
| Example 1 | 192 | 20 | 3.9 | 0.54 | 0.0050 | Δ | ○ |
| Example 2 | 224 | 40 | 4.6 | 0.72 | 0.0039 | ○ | ○ |
| Example 3 | 210 | 60 | 4.7 | 0.79 | 0.0034 | ○ | ○ |
| Example 4 | 250 | 70 | 5.3 | 0.93 | 0.0033 | ○ | ○ |
| Example 5 | 185 | 15 | 3.8 | 0.50 | 0.0050 | Δ | ○ |

Examples 1 to 3

Subsequently, examples of the wavelength conversion member were produced. Wavelength conversion members according to the examples were produced at a predetermined mixing ratio. Specifically, phosphor paste obtained by mixing the resin 10, the phosphor 9, the filler 20 (silica), and a filler (alumina) different from the filler 20 was applied to the entire surface, or the entire one main surface, of the light-transmissive member 4 by screen printing to provide the phosphor layer 3. As the phosphor 9, Examples 1 to 3 employed three types of phosphors: a phosphor 1 and a phosphor 2 represented by $Y_3(Al,Ga)_5O_{12}$:Ce (the peak emission wavelength of the phosphor 1 was about 540 nm, and the peak emission wavelength of the phosphor 2 was about 535 nm) and a phosphor 3 represented by (Sr,Ca)AlSiN$_3$:Eu. The mixing ratio of the phosphors in Examples 1 to 3 was 21.75 mass % for the phosphor 1, 65.25 mass % for the phosphor 2, and 13 mass % for the phosphor 3. A phenyl silicone resin was used for the resin 10. Borosilicate glass formed into a plate was used for the light-transmissive member 4. The light-transmissive member 4 had a rectangular shape 50 mm in length and 75 mm in width in a plan view and had a thickness of about 0.145 mm.

As shown in Table 1, as for Examples 1 to 3, the total content of the three types of phosphors in the phosphor layer 3 was 192 parts by mass to 224 parts by mass relative to 100 parts by mass of the resin, the content of silica as the filler 20 was 20 parts by mass to 60 parts by mass, the content of the filler (alumina) different from the filler 20 was 3.9 parts by mass to 4.7 parts by mass, and the mixture volume ratio of the phosphors and the filler 20 to the resin represented by (silica+phosphors)/resin was 0.54 to 0.79, which fell within the range of 0.5 or more and 1.0 or less. The phosphor layer 3 had a rectangular shape about 42 mm in length and about 67 mm in width in a plan view and had a thickness of about 80 μm. The total thickness of the light-transmissive member 4 and the phosphor layer 3 was about 225 μm. That is, the total thickness of the phosphor layer as the wavelength conversion material and the light-transmissive member fell within the range of 130 μm or more and 300 μm or less.

As for each of the wavelength conversion members produced as described above, light with a peak emission wavelength of 443 nm and a half width of 17.4 nm was emitted at each of a plurality of appropriate points in the emission surface of a wavelength conversion member, and the chromaticity coordinates (x,y) of the color of the light emitted at a respective one of the emission points were measured with a spectrophotometer (product number: PMA-12, manufactured by Hamamatsu Photonics K.K.).

The median particle diameter of the phosphor 9 was 21 μm or more and 24 μm or less.

The resin 10 was a phenyl silicone resin with a refractive index of 1.47. In the case in which a phenyl silicone resin is used, phosphor particles contained in the resin 10 are more likely to aggregate than in the case in which a dimethyl silicone resin is used.

The silica was spherical silica with a median particle diameter of 14 μm and a refractive index of 1.47. Addition of the silica allows the silica to break down the aggregated phosphor particles, so that chromaticity variation in the surface can be reduced. Further, with the silica that does not largely differ in refractive index from the resin 10, the light extraction efficiency is not decreased, so that the luminous flux is unlikely to decrease. Nanosilica with a median particle diameter of 100 nm or less may aggregate because of the large influence of thixotropy, which leads to inability to be screen-printed or deterioration of the application surface. By using silica that has a size substantially equal to the size of the phosphors, the application surface is unlikely to deteriorate. The amount of silica to be added is adjusted so that (silica+phosphors)/resin will be 0.5 or more and 1.0 or less in terms of the mixture volume ratio of the phosphors and the filler 20 to the resin. If the amount is smaller than the above amount, the phosphor particles are likely to aggregate, and chromaticity variation tends to increase. If the amount is larger than the above amount, a large amount of powder existing in the paste makes the viscosity too high, and screen printing itself may not be able to be performed.

Examples 4 and 5

In Example 4, a wavelength conversion member was produced in substantially the same manner as Examples 1 to 3 except that the mixing ratio of the phosphors was set to 22.08 mass % for the phosphor 1, 66.23 mass % for the phosphor 2, and 11.7 mass % for the phosphor 3. As for Example 4, the total content of the three types of phosphors in the phosphor layer 3 was 250 parts by mass relative to 100 parts by mass of the resin, the content of silica as the filler 20 was 70 parts by mass, the content of the filler (alumina) different from the filler 20 was 5.3 parts by mass, and the mixture volume ratio of the phosphors and the filler 20 to the resin represented by (silica+phosphors)/resin was 0.93, which also fell within the range of 0.5 or more and 1.0 or less. The standard deviation (average) of the color tone x was 0.0033, which was almost equal to the standard deviation in Example 3.

In Example 5, a wavelength conversion member was produced using 185 parts by mass of the phosphors at substantially the same mixing ratio as in Examples 1 to 3, 15 parts by mass of silica, and 3.8 parts by mass of alumina. The mixture volume ratio of the phosphors and the filler 20 to the resin represented by (silica+phosphors)/resin was 0.50, which also fell within the range of 0.5 or more and 1.0 or less. The standard deviation (average) of the color tone x was 0.0050, which was equal to the standard deviation in Example 1.

Through observation of the surfaces of the phosphor layers 3 in Examples 1 to 5, unevenness is hardly observed except for Examples 1 and 5 that showed some difference in concentration of the phosphors. As for the coating properties, the phosphor paste was able to be applied to the entire main surface of the light-transmissive member 4 as the phosphor layer 3 by screen printing in all of Examples 1 to 5.

The wavelength conversion members produced as described above were cut into pieces of a predetermined size and disposed in light-emitting devices.

Comparative Examples 1 and 2

In Comparative Examples 1 and 2, light-emitting devices were produced using the same members by the same manufacturing method as in examples with different contents of the phosphors, the filler (alumina) different from the filler 20, and the filler 20 (silica) as shown in Table 1. In Comparative Example 1, the mixture volume ratio of the phosphors and the filler 20 to the resin represented by (silica+phosphors)/resin was 0.37. The coating properties were good, while the surface condition was evaluated as x. In this case, the phosphor particles aggregated because of lack of the number of particles in the paste, which caused unevenness in the arrangement of the phosphors in the phosphor layer 3, and therefore it is considered probable that chromaticity variation in the surface increased.

In Comparative Example 2, the mixture volume ratio of the phosphors and the filler 20 to the resin represented by (silica+phosphors)/resin was 1.18. The coating properties were poor, and the surface condition was not able to be evaluated. In this case, the paste was prevented from being sufficiently supplied onto the screen printing plate and from penetrating the screen printing plate using the squeegee because of the large number of particles in the paste and the resulting high viscosity, and therefore it is considered probable that the paste was not able to be applied to the light-transmissive member 4.

The wavelength conversion members and the light-emitting devices including the wavelength conversion members in the present disclosure can be used for light sources for lighting apparatuses, vehicles, and display devices, backlight sources for displays and liquid-crystal displays, and the like.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A wavelength conversion member comprising:
a light-transmissive member; and
a wavelength conversion material located on a surface of the light-transmissive member, the wavelength conversion material comprising:
a resin,
a phosphor with a median particle diameter of 10 μm or more and 30 μm or less, wherein an amount of the phosphor in the wavelength conversion material is 165 parts by mass or more and 400 parts by mass or less relative to 100 parts by mass of the resin, and
a filler with a median particle diameter of 5 μm or more and 40 μm or less, wherein an amount of the filler in the wavelength conversion material is 5 parts by mass or more and 90 parts by mass or less relative to 100 parts by mass of the resin,
wherein a mixture volume ratio of the phosphor and the filler to the resin is 0.5 or more and 1.0 or less.

2. The wavelength conversion member according to claim 1, wherein the mixture volume ratio of the phosphor and the filler to the resin is 0.6 or more and 0.9 or less.

3. The wavelength conversion member according to claim 1,
wherein a refractive index of the resin is 1.4 or more and 1.6 or less,
wherein a refractive index of the filler is 1.4 or more and 1.8 or less, and
wherein an absolute value of a difference in refractive index between the resin and the filler is 0.35 or less.

4. The wavelength conversion member according to claim 1, wherein the filler comprises at least one of silicon oxide, aluminum oxide, or titanium oxide.

5. The wavelength conversion member according to claim 1, wherein the resin comprises at least one of a phenyl silicone resin or a dimethyl silicone resin.

6. The wavelength conversion member according to claim 1, wherein the phosphor comprises at least one of:
a rare-earth aluminate phosphor comprising Ce, Al, and at least one of Y, La, Lu, Gd, and Tb;
a β-SiAlON phosphor having a composition comprising Si, Al, O, N, and Eu;
a halosilicate phosphor having a composition comprising Ca, Eu, Mg, Si, O, and at least one of F, Cl, or Br;
a nitride phosphor having a composition comprising Ca, Eu, Si, Al, and N, or
a fluoride phosphor having a composition including at least one of an alkali metal or ammonium, at least one of a group 13 element, a group 14 element, fluorine, or Mn.

7. The wavelength conversion member according to claim 1, wherein the phosphor comprises at least one of the Formulas (1) to (5) below:

$$(Y,Lu,Gd)_3(Al,Ga)_5O_{12}:Ce \qquad (1)$$

$$(Ca,Sr,Ba)_8MgSi_4O_{16}(F,Cl,Br)_2:Eu \qquad (2)$$

$$Si_{6-z}Al_zO_zN_{8-z}:Eu\ (0<z\leq 4.2) \qquad (3)$$

$$(Sr,Ca)AlSiN_3:Eu \qquad (4)$$

$$A_2[M1_{1-a}Mn^{4+}{}_aF_6] \qquad (5)$$

wherein in formula (5), A contains at least one of an alkali metal or ammonium; M1 contains at least one of a group 4 element, a group 13 element, or a group 14 element; and a is 0.01<a<0.2.

8. The wavelength conversion member according to claim 1, wherein a standard deviation of a chromaticity at a point on an emission surface excited by light with a peak emission wavelength of 443 nm is 0.0065 or less.

9. The wavelength conversion member according to claim 1, wherein the light-transmissive member comprises at least one of glass, a resin, or a phosphor.

10. The wavelength conversion member according to claim 1, wherein a total thickness of the wavelength conversion material and the light-transmissive member is 130 μm or more and 300 μm or less.

11. A light-emitting device comprising:
a support member;
a light-emitting element on or above the support member;
the wavelength conversion member according to claim 1, above the light-emitting element; and
a light-reflective member on a lateral side of the light-emitting element and the wavelength conversion member,
wherein the light-emitting element is located below a surface of the light-transmissive member on which the wavelength conversion material is located.

* * * * *